United States Patent
Li et al.

(10) Patent No.: US 9,633,970 B2
(45) Date of Patent: Apr. 25, 2017

(54) IGBT DEVICE AND METHOD FOR PACKAGING WHOLE-WAFER IGBT CHIP

(71) Applicant: ZHUZHOU CSR TIMES ELECTRIC CO., LTD., Hunan (CN)

(72) Inventors: Jilu Li, Hunan (CN); Yudong Wu, Hunan (CN); Yongdian Peng, Hunan (CN)

(73) Assignee: ZHUZHOU CSR TIMES ELECTRIC CO., LTD., Hunan (CN)

( * ) Notice: Subject to any disclaimer, the term of this patent is extended or adjusted under 35 U.S.C. 154(b) by 0 days.

(21) Appl. No.: 14/908,994

(22) PCT Filed: Jun. 16, 2014

(86) PCT No.: PCT/CN2014/079932
§ 371 (c)(1),
(2) Date: Jan. 29, 2016

(87) PCT Pub. No.: WO2015/014166
PCT Pub. Date: Feb. 5, 2015

(65) Prior Publication Data
US 2016/0197054 A1 Jul. 7, 2016

(30) Foreign Application Priority Data
Aug. 1, 2013 (CN) .......................... 2013 1 0331846

(51) Int. Cl.
*H01L 29/66* (2006.01)
*H01L 23/00* (2006.01)
(Continued)

(52) U.S. Cl.
CPC ............ *H01L 24/72* (2013.01); *H01L 23/051* (2013.01); *H01L 24/05* (2013.01); *H01L 24/06* (2013.01);
(Continued)

(58) Field of Classification Search
CPC ... H01L 24/72; H01L 29/0696; H01L 23/051; H01L 24/06; H01L 24/05; H01L 29/7395;
(Continued)

(56) References Cited

U.S. PATENT DOCUMENTS 4,734,755 A 3/1988 Schierz
6,303,974 B1 10/2001 Irons et al.
(Continued)

FOREIGN PATENT DOCUMENTS

CN 1362744 A 8/2002
CN 102270640 A 12/2011
(Continued)

OTHER PUBLICATIONS

Extended European Search Report for EP Application No. 14831797.7, mailed Feb. 28, 2017 (9 pages).
(Continued)

*Primary Examiner* — Victor A Mandala
(74) *Attorney, Agent, or Firm* — Patterson Thuente Pedersen, P.A.

(57) ABSTRACT

An IGBT device and a method for packaging a whole-wafer IGBT chip. The IGBT device comprises: an entire wafer IGBT chip, the upper surface thereof comprising a central gate connection zone and a plurality of emitter connection zones surrounding the central gate connection zone, and the lower surface thereof comprising a collecting zone, wherein the emitter connection zones located on the surface of a failure cellular zone of the chip are thinned; a collector washer which is fixed on the lower surface of the chip, and an emitter washer which is fixed on the upper surface of the chip; a collector electrode which is electrically contacted with the collector washer, and an emitter electrode which is
(Continued)

electrically contacted with the emitter washer; and a gate leading wire which is connected to the central gate connection zone.

15 Claims, 4 Drawing Sheets

(51) Int. Cl.
　　　*H01L 29/417*　　(2006.01)
　　　*H01L 29/739*　　(2006.01)
　　　*H01L 23/051*　　(2006.01)
　　　*H01L 29/06*　　(2006.01)

(52) U.S. Cl.
　　CPC .... *H01L 29/0696* (2013.01); *H01L 29/41741* (2013.01); *H01L 29/66333* (2013.01); *H01L 29/7395* (2013.01); *H01L 29/0657* (2013.01); *H01L 2224/05552* (2013.01); *H01L 2224/0612* (2013.01); *H01L 2924/10156* (2013.01); *H01L 2924/13055* (2013.01); *H01L 2924/13091* (2013.01)

(58) Field of Classification Search
　　CPC ......... H01L 29/66333; H01L 29/41741; H01L 2924/13091; H01L 2924/2924; H01L 2924/13055; H01L 2224/0612; H01L 2924/10156; H01L 2224/05552; H01L 29/0657
　　See application file for complete search history.

(56) References Cited

U.S. PATENT DOCUMENTS

| | | | |
|---|---|---|---|
| 6,649,973 B2 | 11/2003 | Takaishi | |
| 7,817,422 B2 * | 10/2010 | Gunturi | F28F 3/12 165/104.33 |
| 2002/0081784 A1 | 6/2002 | Kobayashi et al. | |
| 2004/0256691 A1 | 12/2004 | Nemoto et al. | |
| 2009/0189240 A1 * | 7/2009 | Willmeroth | H01L 29/0619 257/488 |
| 2009/0267200 A1 * | 10/2009 | Gutt | H01L 21/26513 257/655 |
| 2012/0037955 A1 * | 2/2012 | Hirler | H01L 21/26506 257/140 |
| 2013/0328104 A1 * | 12/2013 | Jonishi | H01L 29/7393 257/139 |

FOREIGN PATENT DOCUMENTS

| | | |
|---|---|---|
| CN | 102768999 A | 11/2012 |
| CN | 103390642 A | 11/2013 |
| EP | 0702406 A2 | 3/1996 |
| JP | H 0737914 A | 2/1995 |
| JP | H 0758235 A | 3/1995 |
| JP | H 08186258 A | 7/1996 |
| JP | H 10107051 A | 4/1998 |

OTHER PUBLICATIONS

International Search Report for PCT/CN2014/079932, mailed Sep. 3, 2014, 5 pages.

English translation of International Search Report for PCT/CN2014/079932, mailed Sep. 3, 2014, 3 pages.

* cited by examiner

IGBT DEVICE AND METHOD FOR PACKAGING WHOLE-WAFER IGBT CHIP

CROSS REFERENCE OF RELATED APPLICATION

This application is the national phase of International Application No. PCT/CN2014/079932, titled "IGBT DEVICE AND METHOD FOR PACKAGING WHOLE-WAFER IGBT CHIP", and filed on Jun. 16, 2014, which claims priority to Chinese Patent Application No. 201310331846.9, titled "IGBT DEVICE AND PACKAGING METHOD FOR WHOLE-WAFER IGBT CHIP", filed with the Chinese State Intellectual Property Office on Aug. 1, 2013, both of which are incorporated herein by reference in their entireties.

FIELD

The present disclosure relates to the technical field of semiconductor device fabrication, and in particular to an IGBT device and a method for packaging a whole-wafer IGBT chip.

BACKGROUND

An insulated gate bipolar transistor (Insulated Gate Bipolar Transistor, abbreviated as IGBT) has the advantages of an MOSFET device such as a high input impedance and the advantages of a giant transistor (i.e., Giant Transistor, abbreviated as GTR) such as a high-speed switching characteristic, and is widely applied to an alternating current motor, a frequency converter, a switching power supply, a lighting circuit and traction drive or other fields.

In fabricating the IGBT device, multiple separate IGBT cellular zones (each of the IGBT cellular zones includes multiple IGBT cells) are generally formed on a wafer firstly, and are cut into multiple single-grained IGBT chips. Each of the IGBT chips includes a separate cellular emitter, a separate cellular collector and a separate cellular gate. Then, qualified IGBT chips are interconnected and packaged, to form an IGBT device. However, the IGBT device fabricated by the method described above has a low utilization rate of package size since the IGBT device is formed through interconnection and packaging of multiple IGBT chips, thereby leading to a low utilization rate of current-carrying area in the device and a weak current-carrying capacity; the IGBT chips may come from different wafers, which results in that the IGBT chips have different thickness and electrical parameters, the IGBT chips are under different pressure when being packaged, and it is difficult to control the electrical parameters of the IGBT device after packaging.

In diagram of this, an IGBT device formed through packaging a whole-wafer IGBT chip emerges. In the whole-wafer IGBT chip, multiple interconnected IGBT cellular zones are formed on a wafer, and the whole-wafer IGBT chip can be packaged directly without cutting, to form the IGBT device. The IGBT cellular zones have high integration and a strong current-carrying capacity. In addition, the whole wafer is packaged, thus package pressure is uniform, and it is easy to control the electrical parameters.

A failure cellular zone exists in the cellular zones of the whole-wafer IGBT chip, and the failure cellular zone may have a harmful effect on the performance of the IGBT device. To avoid the harmful effect of the failure cellular zone on the performance of the IGBT device is an urgent issue in fabricating the IGBT device.

SUMMARY

In view of this, an IGBT device and a method for packaging a whole-wafer IGBT chip are provided in the present disclosure, to prevent the failure cellular zone in the whole-wafer chip from adversely affecting the performance of the IGBT device.

To realize the object described above, the following technical solution is provided in the present disclosure.

An IGBT device is provided. The IGBT device includes:

a whole-wafer IGBT chip, where an top surface of the whole-wafer IGBT chip comprises a central gate connection zone and a plurality of emitter connection zones surrounding the central gate connection zone, and a bottom surface of the whole-wafer IGBT chip comprises a collecting zone, where an emitter connection zone located on a surface of a failure cellular zone of the chip is thinned;

a collector gasket fixed on the bottom surface of the chip and an emitter gasket fixed on the top surface of the chip, where a radius of the collector gasket is less than a radius of the chip, the collector gasket covers the collecting zone, a radius of the emitter gasket is less than the radius of the chip, and the emitter gasket covers the emitter connection zones but does not cover a terminal zone of the chip;

a collector electrode in electrical contact with the collector gasket and an emitter electrode in electrical contact with the emitter gasket; and a gate leading wire connected to the central gate connection zone, where the gate leading wire is insulated from the emitter gasket and the emitter electrode.

Preferably, the IGBT device further includes:

a limit collar, configured to fix and limit the collector gasket and the emitter gasket, fix the collector gasket on the bottom surface of the chip and fix the emitter gasket on the top surface of the chip.

Preferably, in the IGBT device, the locating collar includes:

an outer ring, where a diameter of a lower opening of the outer ring is the same as a diameter of the collector gasket, and an upper opening of the outer ring includes a first circular groove and a second circular groove, where a diameter of the first circular groove is equal to a diameter of the chip, and a diameter of the second circular groove is greater than the diameter of the chip; and an inner ring, where an outside diameter of the inner ring is equal to the diameter of the second groove, and an inside diameter of the inner ring is equal to a diameter of the emitter gasket.

Preferably, in the IGBT device, the collector electrode includes a loading platform carrying the collector gasket, the loading platform is in a shape of cylinder, a diameter of the cylinder is the same as a diameter of the collector gasket, and both the loading platform and the collector gasket are fixed in the lower opening of the outer ring.

Preferably, in the IGBT device, the locating collar includes:

an outer ring, where an upper opening of the outer ring includes a circular groove having a same diameter as a diameter of the chip, a diameter of a lower opening of the outer ring is the same as a diameter of the collector gasket; and an inner ring, where an outside diameter of the inner ring is the same as the diameter of the chip, and an inner diameter of the inner ring is the same as a diameter of the emitter gasket.

Preferably, in the IGBT device, where the locating collar is a collar in an integrated structure surrounding a side face of the chip, an upper opening of the collar is matched with the emitter gasket, and a lower opening of the collar is matched with the collector gasket.

Preferably, in the IGBT device, where a via hole is provided at a central position of the emitter gasket, a groove is provided on a bottom surface of the emitter electrode, the gate leading wire is connected to the central gate connection zone through the via hole and is extended outside through the groove.

Preferably, in the IGBT device, where the gate leading wire is connected to the central gate connection zone through soldering; or the gate leading wire is fixed through a spring provided in the via hole, and is connected to the central gate connection zone under pressure of the spring.

A method for packaging a whole-wafer IGBT chip is further provided. A top surface of the chip includes a central gate connection zone and a plurality of emitter connection zones surrounding the central gate connection zone, and a bottom surface of the chip includes a collecting zone. The method for packaging the whole-wafer IGBT chip includes:

thinning an emitter connection zone of a failure cellular zone of the chip;

fixing a collector gasket and an emitter gasket, where the collector gasket is fixed on the bottom surface of the chip, a radius of the collector gasket is less than a radius of the chip, the collector gasket covers the collecting zone, the emitter gasket is fixed on the top surface of the chip, a radius of the emitter gasket is less than the radius of the chip, and the emitter gasket covers the emitter connection zones but does not cover a terminal zone of the chip;

connecting a collector electrode and connecting an emitter electrode respectively, where the collector electrode is in electrical contact with the collector gasket, and the emitter electrode is in electrical contact with the emitter gasket; and connecting a gate leading wire, where the gate leading wire is connected to the central gate, and is insulated from the emitter gasket and the emitter electrode.

Preferably, in the method for packaging the whole-wafer IGBT chip, the collector gasket and the emitter gasket are fixed and limited through a locating collar, the collector gasket is fixed on the bottom surface of the chip, and the emitter gasket is fixed on the top surface of the chip.

Preferably, in the method, the collector gasket and the emitter gasket are fixed and limited through a package collar in the following steps:

fixing the collector gasket on the bottom surface of the chip through an outer ring, where an upper opening of the outer ring comprises a first circular groove and a second circular groove, where a diameter of the first circular groove is equal to a diameter of the chip, the chip is fixed in the first circular groove, a diameter of the second circular groove is greater than the diameter of the chip, a diameter of a lower opening of the outer ring is the same as a diameter of the collector gasket, the collector gasket is fixed inside the lower opening and is contacted with the bottom surface of the chip; and fixing the emitter gasket on the top surface of the chip through an inner ring, where an outside diameter of the inner ring is equal to the diameter of the second groove, the inner ring is fixed in the second groove, an inside diameter of the inner ring is equal to a diameter of the emitter gasket, and the emitter gasket is fixed inside the inner ring and is in contact with the top surface of the chip.

Preferably, in the method, a loading platform is provided on the collector electrode, the loading platform is in a shape of cylinder, a diameter of the cylinder is the same as the diameter of the collector gasket, to carry the collector gasket, and both the loading platform and the collector gasket are fixed inside the lower opening of the outer ring.

Preferably, in the method, the collector gasket and the emitter gasket are fixed and limited through the locating collar in the following steps:

fixing the collector gasket on the bottom surface of the chip through an outer ring, where an upper opening of the outer ring comprises a fixed groove having a same diameter as a diameter of the chip, the chip is fixed in the fixed groove, a diameter of a lower opening of the outer ring is the same as a diameter of the collector gasket, the collector gasket is fixed inside the lower opening and is in contact with the bottom surface of the chip; and fixing the emitter gasket on the top surface of the chip through an inner ring, where an outside diameter of the inner ring is equal to a diameter of the groove, the inner ring is provided in the fixed groove where the chip is fixed, an inside diameter of the inner ring is equal to a diameter of the emitter gasket, the emitter gasket is fixed inside the inner ring and is in contact with the top surface of the chip.

Preferably, in the method, the collector gasket and the emitter gasket are fixed and limited through the locating collar in the following steps:

forming a collar in an integrated structure surrounding a side face of the chip on the side face of the chip, where an upper opening of the collar is matched with the emitter gasket, and a lower opening of the collar is matched with the collector gasket;

fixing the collector gasket onto the bottom surface of the chip through the lower opening; and fixing the emitter gasket onto the top surface of the chip through the upper opening.

Preferably, in the method, the emitter connection zone of the failure cellular zone of the chip is thinned through laser etching or mechanical grinding.

It can be seen from the technical solution described above that, the IGBT device provided in the present disclosure is formed through packaging the whole-wafer IGBT chip. The emitter connection zone on the surface of the failure cellular zone of the chip is thinned, therefore, through the process of thinning, the emitter connection zone on the surface of the failure cellular zone may be lower than a common plane where other emitter connection zones are located, or the emitter connection zone on the surface of the failure cellular zone may be removed. Since no emitter connection zone (the emitter connection zone is thinned to be removed) is provided on the surface of the failure cellular zone, or the emitter connection zone on the surface of the failure cellular zone is lower than the common plane where other emitter connection zones are located, the failure cellular zone is disconnected to the emitter gasket, thereby avoiding the harmful effect of the failure cellular zone on the performance of the IGBT device, and achieving the reliability of the IGBT device.

DETAILED DESCRIPTION OF THE EMBODIMENTS

As described in the background, there is a failure cellular zone in cellular zones of a conventional whole-wafer IGBT chip, and the failure cellular zone has a harmful effect on the IGBT device. To avoid the harmful effect of the failure cellular zone on the performance of the IGBT device is an urgent problem in fabricating the IGBT device.

The failure cellular zone occurs for two reasons. A first reason is a too large gate leakage current in the failure cellular zone, and a second reason is a too large leakage current between the collector and the emitter of the failure cellular zone.

In fabricating the whole-wafer IGBT chip, a gate of a failure cellular zone caused by the first reason is disconnected to a central gate connection zone of the whole-wafer IGBT chip through laser ablation or other processes, thereby avoiding the harmful effect of the failure cellular zone on the performance of the IGBT device.

For a failure cellular zone caused by the second reason, an emitter gasket with a set structure may be provided, and the failure cellular zone may be aligned with a set zone of the emitter gasket, so that the failure cellular zone is disconnected to the emitter electrode, thereby avoiding the harmful effect of the failure cellular zone on the performance of the IGBT device. However, in this processing mode, it is required to label the failure cellular zone and make the failure cellular zone strictly correspond to the set zone of the emitter gasket, which requires a high operation accuracy and complex process for aligning the failure cellular zone with the emitter gasket.

The inventor finds that, the emitter connection zone of the failure cellular zone caused by the second reason may be thinned, to disconnect the failure cellular zone to the emitter gasket, thereby disconnecting the failure cellular zone to the emitter electrode.

Based on the research described above, an IGBT device is provided in the present disclosure. The IGBT device includes:

a whole-wafer IGBT chip, where an top surface of the whole-wafer IGBT chip includes a central gate connection zone and multiple emitter connection zones surrounding the central gate connection zone, and a bottom surface of the whole-wafer IGBT chip includes a collecting zone, where an emitter connection zone located on a surface of a failure cellular zone of the chip is thinned;

a collector gasket fixed on the bottom surface of the chip, and an emitter gasket fixed on the top surface of the chip, where a radius of the collector gasket is less than a radius of the chip, the collector gasket covers the collecting zone, a radius of the emitter gasket is less than a radius of the chip, and the emitter gasket covers the emitter connection zones and does not cover a terminal zone of the chip;

a collector electrode in electrical contact with the collector gasket and an emitter electrode in electrical contact with the emitter gasket; and a gate leading wire connected to the central gate connection zone, where the gate leading wire is insulated from the emitter gasket and the emitter electrode.

In the technical solution described above, the emitter connection zone on the surface of the failure cellular zone of the chip is thinned, therefore, through the process of thinning, the emitter connection zone on the surface of the failure cellular zone may be lower than a common plane where other emitter connection zones are located, or the emitter connection zone on the surface of the failure cellular zone may be removed. Since no emitter connection zone (the emitter connection zone is thinned to be removed) is provided on the surface of the failure cellular zone, or the emitter connection zone on the surface of the failure cellular zone is lower than the common plane where other emitter connection zones are located, the failure cellular zone is disconnected to the emitter gasket, thereby avoiding the harmful effect of the failure cellular zone on the performance of the IGBT device, and achieving the reliability of the IGBT device.

The foregoing is a core idea of the present disclosure. Technical solutions according to embodiments of the present disclosure will be described clearly and completely hereinafter in conjunction with drawings. Apparently, the embodiments described are only a part rather than all of the embodiments of the present disclosure. All other embodiments obtained by those skilled in the art without any creative work based on the embodiments of the present disclosure fall within the scope of protection of the present disclosure.

Specific details will be set forth in the following description to sufficiently understand the present disclosure, however, the present disclosure can also be implemented in other ways different from the way described here, and similar extension can be made by those skilled in the art without departing from the spirit of the present disclosure, therefore the present disclosure is not limited to specific embodiments disclosed hereinafter.

In addition, the present disclosure is described in conjunction with diagrams. When the embodiments of the present disclosure are described in detail, for ease of illustration, a diagram showing a structure of a device is not enlarged partially in a regular scale, the diagrams are only examples, and are not intended to limit the protection scope of the present disclosure. Furthermore, in an actual manufacture process, three-dimensional space sizes, i.e. length, width and depth, should be considered.

A First Embodiment

Based on the above idea, an IGBT device with a whole-wafer IGBT chip package is provided according to the embodiment of the present disclosure. A top surface of the whole-wafer IGBT chip includes a central gate connection zone and multiple emitter connection zones surrounding the central gate connection zone, and a bottom surface of the whole-wafer IGBT chip includes a collecting zone. An emitter connection zone on a surface of a failure cellular zone of the chip is thinned.

Figure 1:
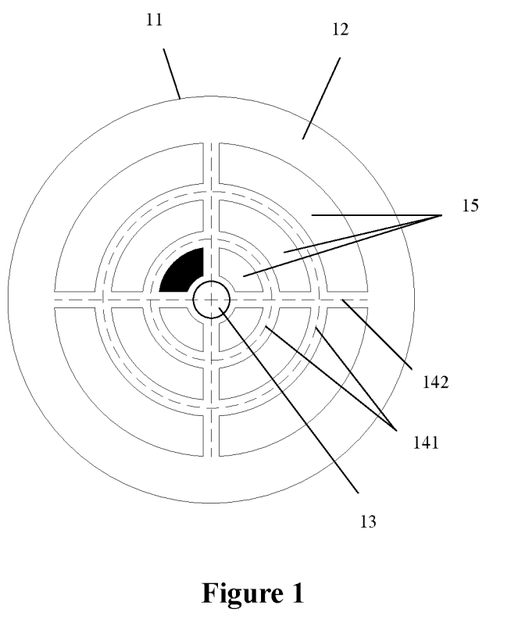
FIG. 1 is a structural diagram of a whole-wafer IGBT chip according to an embodiment of the present disclosure.

Referring to FIG. 1, the whole-wafer IGBT chip includes: a whole-wafer substrate 11, a gate interconnection layer disposed on an top surface of the whole-wafer substrate 11, a central gate connection zone 13 disposed on an top surface of the gate interconnection layer and an emitter interconnection layer surrounding the central gate connection zone 13.

The whole-wafer substrate 11 includes an active region and a terminal region 12 surrounding the active region. Multiple IGBT cellular zones are disposed within the active region.

The gate interconnection layer is located on the top surface of the whole-wafer substrate 11 (i.e., a top surface of the active region). The gate interconnection layer includes: a conductive connection part for interconnecting gates of the multiple IGBT cellular zones, where the conductive connection part, as a common gate of respective IGBT cellular zones, is electrically connected to the central gate connection zone 13; and an insulation part, which is partitioned, by the conductive connection part, into multiple spaced regions.

The conductive connection part includes: a circular connection zone located on the top surface of the whole-wafer substrate 11 and concentric with the whole-wafer substrate 11, where the central gate connection zone 13 is disposed on an top surface of the circular connection zone; multiple concentric ring gate connection zones 141 surrounding the circular connection zone, where the ring gate connection zones 141 are spaced; and radial gate connection zones 142 which connects the ring gate connection zones 141 and the circular connection zone. The ring gate connection zones 141 are concentric with the whole-wafer substrate 11. The number of the ring gate connection zones 141 and the number of the radial gate connection zones 142 may be set based on design parameters of the IGBT.

The emitter interconnection layer is located on a top surface of the gate interconnection layer and surrounds the central gate connection zone 13. The emitter interconnection layer includes multiple emitter connection zones 15 in a shape of spaced partial ring, the emitter connection zones 15 are located on a top surface of the insulation part and have a one-to-one correspondence with the insulation part. Each of the emitter connection zones 15 is electrically connected to an emitter of the IGBT cellular zone below the gate interconnection layer via a via hole through the gate interconnection layer.

Figure 2:
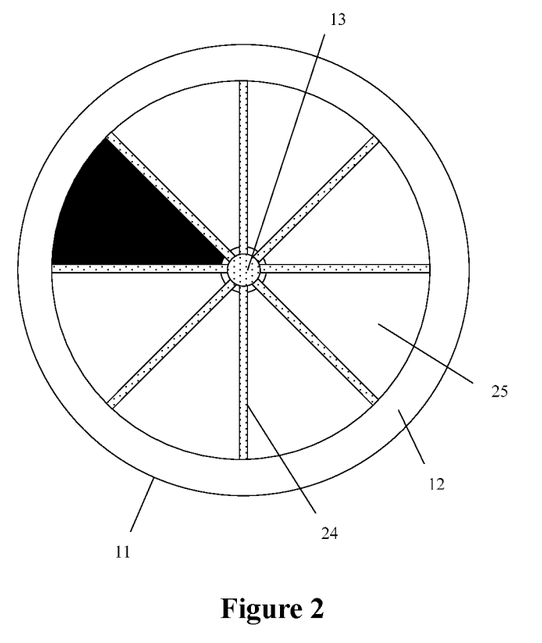
FIG. 2 is a structural diagram of a whole-wafer IGBT chip according to another embodiment of the present disclosure.

The whole-wafer IGBT chip may be alternatively shown as FIG. 2, the gate interconnection layer of the whole-wafer IGBT chip shown in FIG. 2 includes an insulation part and a conductive connection part. The conductive connection part includes: a circular connection zone located on the top surface of the whole-wafer substrate 11 and concentric with the whole-wafer substrate 11, where the central gate connection zone 13 is disposed on a top surface of the circular connection zone; and multiple radial gate connection zones 24. The insulation part is in a sector structure and is located between two radial gate connection zones 24. An emitter connection zone 25 is disposed on a top surface of the insulation part.

Figure 3A:
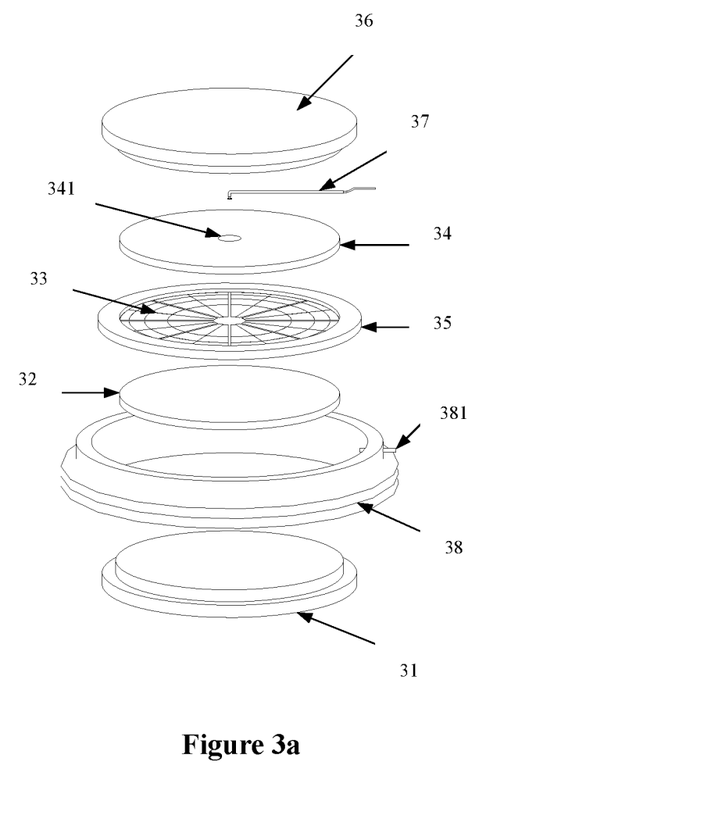
FIG. 3a is an explosion diagram of an IGBT device according to an embodiment of the present disclosure.

Black areas shown in FIG. 2 and FIG. 3 indicate that the emitter connection zone on a surface of the failure cellular zone of the chip is thinned, to remove the emitter connection zone on the surface of the failure cellular zone or make the emitter connection zone on the surface of the failure cellular zone lower than a common plane where other emitter connection zones are located. The thinning process is realized through laser etching, mechanical grinding or the like.

Figure 3B:
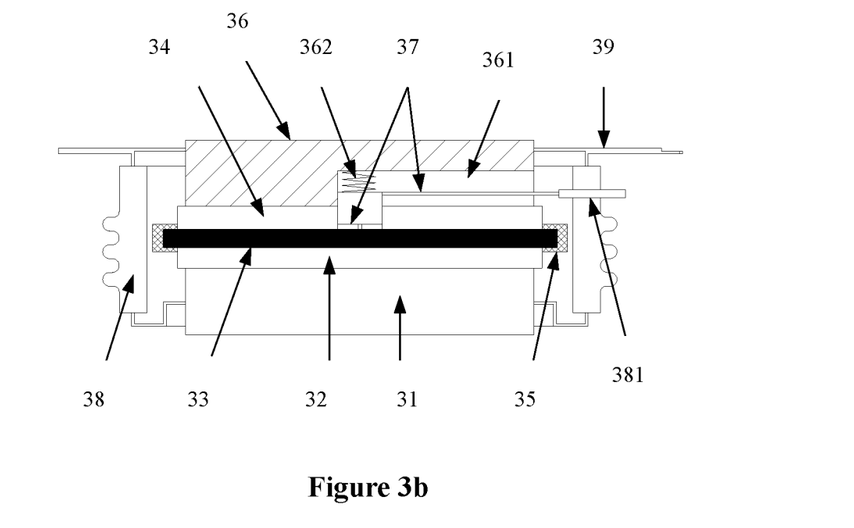
FIG. 3b is a sectional view of an IGBT device according to an embodiment of the present disclosure.

Referring to FIG. 3a and FIG. 3b, an IGBT device is provided according to the embodiment. The IGBT device includes: a whole-wafer IGBT chip 33, a collector gasket 32, an emitter gasket 34, a collector electrode 31, an emitter electrode 36 and a gate leading wire 37.

The whole-wafer IGBT chip 33 is a whole-wafer IGBT chip in which the emitter connection zone of the failure cellular zone is thinned, where a top surface of the whole-wafer IGBT chip 33 includes a central gate connection zone and multiple emitter connection zones surrounding the central gate connection zone, and a bottom surface of the whole-wafer IGBT chip includes a collecting zone. For a structure of the whole-wafer IGBT chip 33, FIG. 1 and FIG. 2 may be referred to, but the disclosure is not limited to the structures shown in FIG. 1 and FIG. 2.

Since no emitter connection zone (the emitter connection zone is thinned to be removed) is provided on the surface of the failure cellular zone of the chip, or the emitter connection zone on the surface of the failure cellular zone of the chip is lower than the common plane where other emitter connection zones are located, the failure cellular zone is disconnected to the emitter gasket, thereby avoiding the harmful effect of the failure cellular zone on the performance of the IGBT device, and achieving the reliability of the IGBT device.

A shape of the emitter gasket 34 which is circular is matched with a shape of the active region of the whole-wafer IGBT chip 33, and a radius of the emitter gasket 34 is less than a radius of the whole-wafer IGBT chip 33. The emitter gasket 34 is fixed on the top surface of the whole-wafer IGBT chip 33 and covers the emitter connection zones of the whole-wafer IGBT chip 33, but does not cover the terminal zone of the whole-wafer IGBT chip 33.

A shape of the collector gasket 32 which is circular is matched with a shape of the collecting zone of the whole-wafer IGBT chip 33, and a radius of the collector gasket 32 is less than the radius of the whole-wafer IGBT chip 33. The collector gasket 32 is fixed on the bottom surface of the whole-wafer IGBT chip 33 and covers the collecting zone of the whole-wafer IGBT chip 33.

Preferably, in the embodiment, the radius of the collector gasket 32 is the same as a radius of the collecting zone, and the radius of the emitter gasket 34 is the same as a radius of the active region.

The collector electrode 31 is located on a bottom surface of the collector gasket 32, and the collector electrode 31 is in electrical contact with the collector gasket 32. The emitter electrode is located on a top surface of the emitter gasket 34, and the emitter electrode is in electrical contact with the emitter gasket 34.

The gate leading wire 37 is connected to the central gate connection zone, and is insulated from the emitter gasket 34 and the emitter electrode.

The above components may be packaged by a package housing 38. A shape of an upper opening of the package housing 38 is matched with a shape of the emitter electrode 36, and a shape of a lower opening of the package housing 38 is matched with a shape of the collector electrode 31.

A via hole 341 is provided at a central position of the emitter gasket 34, a via hole 381 is provided on the package housing 38, a groove 361 is provided on the bottom surface of the emitter electrode 36, and the gate leading wire 37 is extended outside via the via hole 341, the via hole 381 and the groove 361. Preferably, a wire conduit may be provided in the via hole 381 to extend the gate leading wire 37 outside.

A ceramic housing having good heat dissipation and mechanical strength may be used as the package housing 38. The upper opening and the lower opening of the package housing 38 are encapsulated by a skirt 39.

In the embodiment, the gate leading wire 37 and the central gate connection zone are fixed through a spring 362 provided between the emitter electrode 36 and the emitter gasket 34, and the gate leading wire 37 is electrically connected to the central gate connection zone under pressure of the spring 362, or alternatively, the gate leading wire 37 and the central gate connection zone can be permanently connected through soldering.

The collector gasket 32, the whole-wafer IGBT chip 33 and the emitter gasket 34 can be fixed and limited by a locating collar 35.

Figure 4:
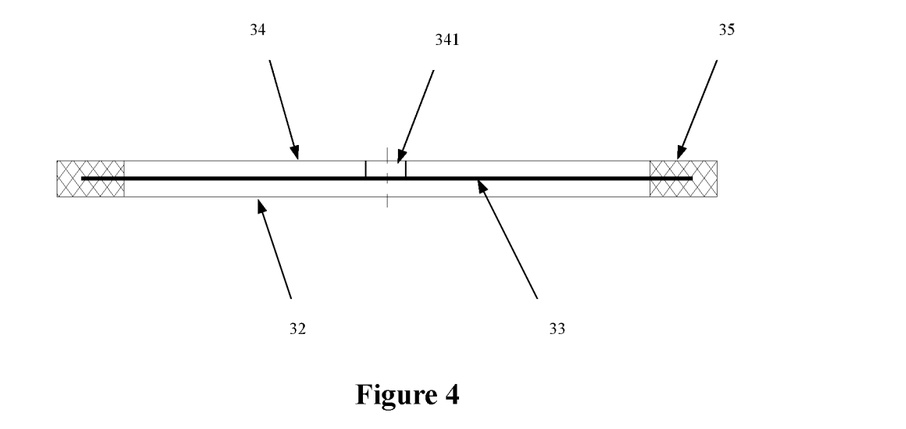
FIG. 4 is a diagram of a principle of fixing and limiting of a locating collar according to an embodiment of the present disclosure.

Referring to FIG. 4, the locating collar 35 is a collar in an integrated structure surrounding a side face of the whole-wafer IGBT chip 33, and is formed through glue injection or other process. An upper opening of the locating collar 35 is matched with the emitter gasket 34, i.e., a radius of the upper opening is the same as a radius of the emitter gasket 34, and the emitter gasket 34 is fixed inside the upper opening. A lower opening of the locating collar 35 is matched with the collector gasket 32, i.e., a radius of the lower opening is the same as a radius of the collector gasket 32, and the collector gasket 32 is fixed inside the lower opening.

Figure 5:
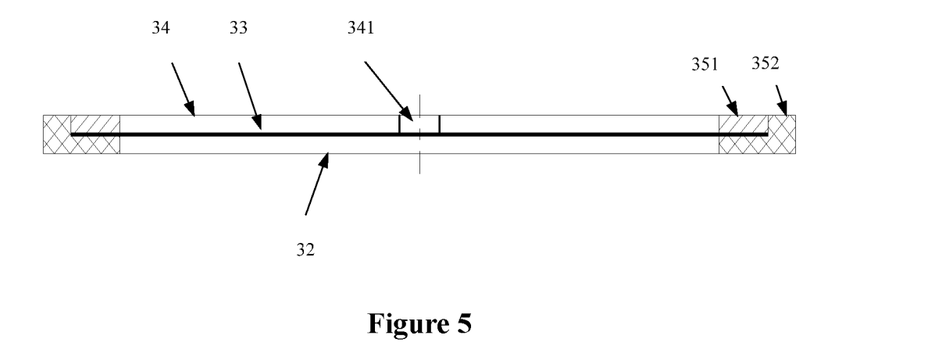
FIG. 5 is a diagram of a principle of fixing and limiting for a locating collar according to another embodiment of the present disclosure.

Referring to FIG. 5, the locating collar 35 may be alternatively a collar having a separable structure including an inner ring 351 and an outer ring 352.

An upper opening of the outer ring 352 includes a circular groove having a same diameter as a diameter of the whole-wafer IGBT chip 33, so that the IGBT chip 33 can be fixed in the groove. A diameter of a lower opening of the outer ring 352 is the same as a diameter of the collector gasket 32, in order to fix the collector gasket 32.

An outer diameter of the inner ring 351 is the same as the diameter of the whole-wafer IGBT chip 33, so that the inner ring 351 can be fixed in the groove in which the IGBT chip 33 is placed. An inner diameter of the inner ring 351 is equal to a diameter of the emitter gasket 33, in order to fix the emitter gasket 33.

Figure 6:
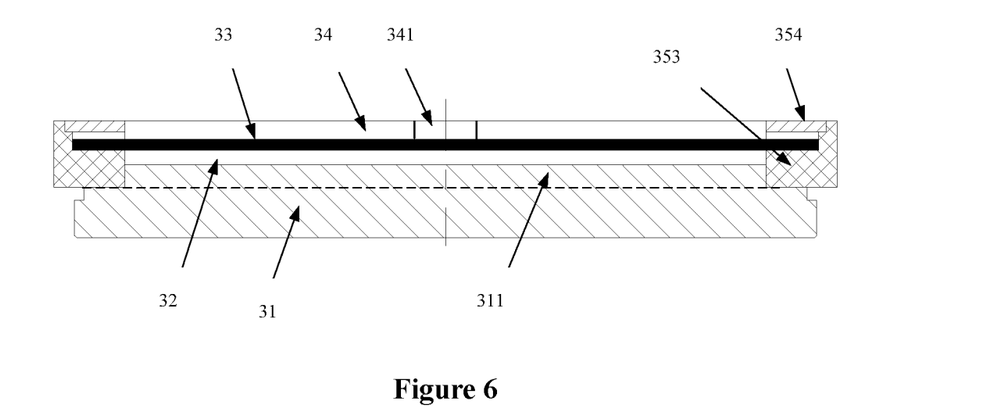
FIG. 6 is a diagram of a principle of fixing and limiting for a locating collar according to yet another embodiment of the present disclosure.

The locating collar 35 having the structure shown in FIG. 5 may be improved, to locating and fix the collector electrode. As shown in FIG. 6, a different groove structure is provided to prevent the IGBT chip from being squeezed by the inner ring.

The locating collar 35 having a structure shown in FIG. 6 includes an outer ring 353 and an inner ring 354.

A diameter of a lower opening of the outer ring 353 is the same as a diameter of the collector gasket 32, in order to fix the collector gasket 32. An upper opening of the outer ring 353 includes a first circular groove and a second circular groove. A diameter of the first circular groove is equal to a diameter of the whole-wafer IGBT chip 33, so that the whole-wafer IGBT chip 33 is fixed in the first groove; a diameter of the second circular groove is greater than the diameter of the whole-wafer IGBT chip 33.

An outside diameter of the inner ring 354 is equal to a diameter of the second groove so that the inner ring 354 can be fixed in the second groove, and an inside diameter of the inner ring 354 is equal to a diameter of the emitter gasket 34, so that the emitter gasket 34 may be fixed.

The collector electrode 31 includes a loading platform 311. The loading platform is in a shape of a cylinder, a diameter of the cylinder is the same as a diameter of the collector gasket 32, and the loading platform 311 and the collector gasket 32 are both fixed inside the lower opening of the outer ring 353. A sum of a height of the loading platform 311 and a thickness of the collector gasket 32 is matched with a height from the bottom surface of the outer ring 353 to a bottom of the first groove (the sum of the height of the loading platform 311 and the thickness of the collector gasket 32 is equal to or is slightly greater than the height from the bottom surface of the outer ring 353 to the bottom of the first groove). Preferably, a sum of the height of the loading platform, the thickness of the collector gasket and a thickness of the IGBT chip is not greater than a distance from the bottom surface of the outer ring to a bottom surface of the second groove.

In a case that the whole-wafer IGBT chip 33, the emitter gasket 34 and the collector electrode 31 are fixed and limited through the inner ring 354 and the outer ring 353, top surfaces of the inner ring 354, the outer ring 353 and the emitter gasket 34 are flush with each other (are located in a same plane), or the emitter gasket 34 is slightly higher than a plane in which the inner ring 354 and the outer ring 353 are located.

The limit collars having the structures shown in FIG. 4 and FIG. 5 can also fix a collector having the loading platform. It is only required to set a depth of the lower opening of the limit collar so that the lower opening can fix both the collector gasket 32 and the loading platform.

It can be known from the description that, the IGBT device according to the embodiment is formed through packaging the whole-wafer IGBT chip in which the emitter electrode of the failure cellular zone is thinned. In this case, only a simple circular emitter gasket is required. When the emitter gasket and the whole-wafer IGBT chip are fixed and limited, it is only required to align the centers of the emitter gasket and the whole-wafer IGBT chip, then the failure cellular zone is disconnected to the emitter gasket, thereby avoiding the harmful effect of the failure cellular zone on the performance of the IGBT device, and achieving the reliability of the IGBT device.

In the IGBT device, the collector gasket, the whole-wafer IGBT chip and the emitter gasket are fixed and limited through a locating collar having a particular structure. Moreover, a collector electrode having a set structure can also be fixed and limited by the locating collar. The locating collar has a simple structure, and it is convenient to operate when fixing and limiting.

A Second Embodiment

A method for packaging a whole-wafer IGBT chip is provided according to the embodiment of the present disclosure. A top surface of the whole-wafer IGBT chip includes a central gate connection zone and multiple emitter connection zones surrounding the central gate connection zone, and a bottom surface of the whole-wafer IGBT chip includes a collecting zone.

Figure 7:
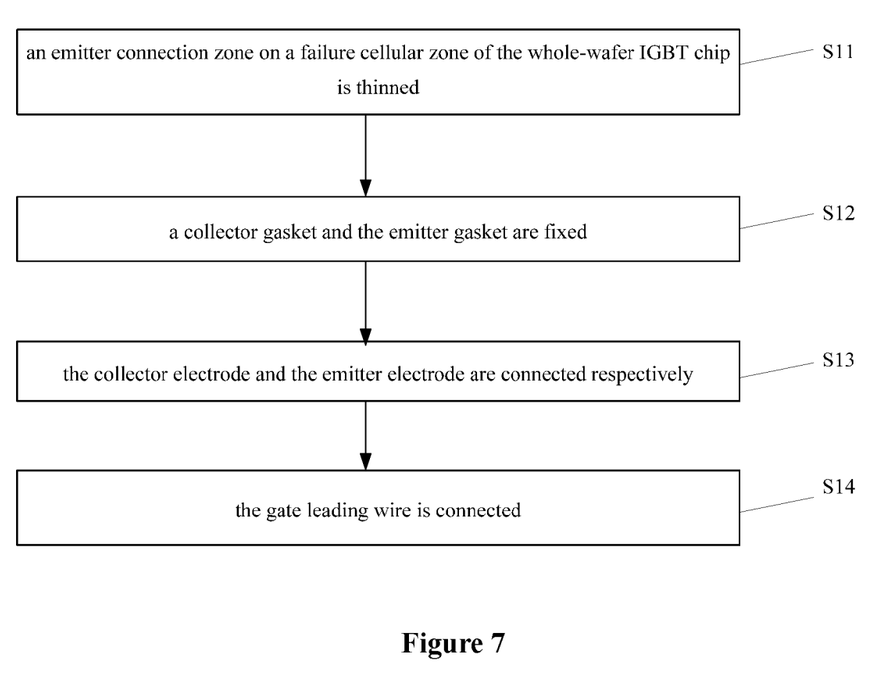
FIG. 7 is a flowchart of a method for packaging a whole-wafer IGBT chip according to an embodiment of the present disclosure.

Referring to FIG. 7, the method for packaging the whole-wafer IGBT chip includes step S11 to step S14.

In step S11, an emitter connection zone on a failure cellular zone of the whole-wafer IGBT chip is thinned.

In the conventional packaging process, in order to avoid an effect of the failure cellular zone on the performance of the IGBT device, an emitter gasket is generally processed, for example, hollowing is performed at a particular position of the emitter gasket. Then a hollowed position is provided correspondingly to the failure cellular zone in a process of packaging, so that the failure cellular zone is disconnected to the emitter electrode, thereby achieving the performance of the IGBT device. An operation of aligning the hollowed position with the failure cellular zone is difficult, and work efficiency is low.

In the embodiment, the whole-wafer IGBT chip is detected to determine the failure cellular zone, and the emitter connection zone of the failure cellular zone is thinned, so that the emitter connection zone is lower than a common plane where other emitter connection zones are located, or the emitter connection zone is thinned to be removed. The thinning may be realized through processes such as laser etching or mechanical grinding. In this way, when the emitter gasket is disposed subsequently, the failure cellular zone is insulated from the emitter gasket since the emitter gasket in the failure cellular zone is thinned to be removed, or is lower than the common plane where other emitter connection zones are located. Only an emitter gasket in a shape matching the whole-wafer IGBT chip is required to cover an active region of the whole-wafer IGBT chip. When aligning the emitter gasket with the whole-wafer IGBT chip, operation is simple and work efficiency is high.

In step S12, a collector gasket and the emitter gasket are fixed.

The collector gasket is fixed on the bottom surface of the chip, a radius of the collector gasket is less than a radius of the chip, and the collector gasket covers the collecting zone. The emitter gasket is fixed on the top surface of the chip, a radius of the emitter gasket is less than a radius of the chip, and the emitter gasket covers the emitter connection zone and does not cover a terminal zone of the chip.

As described above, the emitter connection zone of the failure cellular zone of the whole-wafer IGBT chip is thinned, it is only required to align a center of the whole-wafer IGBT chip with a center of the emitter gasket in alignment, which is simple and fast.

For quickness and accuracy, the emitter gasket, the whole-wafer IGBT chip and the collector gasket may be fixed and limited through a locating collar.

The locating collar in the structure shown in FIG. 4 according to the first embodiment may be used to perform fixing and limiting operation. Firstly, a collar in an integrated structure surrounding a side face of the thinned whole-wafer IGBT chip is formed at the side face of the thinned whole-wafer IGBT chip. The locating collar may be formed through glue injection. Then the emitter gasket is fixed on the top surface of the whole-wafer IGBT chip through the upper opening of the collar, and the collector gasket is fixed on the bottom surface of the whole-wafer IGBT chip through the lower opening of the collar.

The locating collar in the structure shown in FIG. 5 according to the embodiment described above may also be used to perform fixing and limiting operation. Firstly, the thinned whole-wafer IGBT chip is placed in the groove of the upper opening of the outer ring 352, then is placed on the top surface of the whole-wafer IGBT chip through the inner ring 351 and fixed in the groove together with the inner ring 351. Finally, the emitter gasket is fixed on the top surface of the whole-wafer IGBT chip through the inner ring 352, and the collector gasket is fixed on the bottom surface of the whole-wafer IGBT chip through the lower opening of the outer ring 352.

The locating collar in the structure shown in FIG. 6 according to the embodiment described above may also be used to perform fixing and limiting operation. Firstly, the thinned whole-wafer IGBT chip is placed in the first groove of the outer ring 353, to be fixed. Then the inner ring 354 is fixed in the second groove of the outer ring 353. Finally, the emitter gasket is fixed on the top surface of the whole-wafer IGBT chip through the inner ring 354, and the collector gasket is fixed on the bottom surface of the whole-wafer IGBT chip through the lower opening of the outer ring 353.

It can be seen that, for the implementation of fixing and limiting through the locating collar, the operation is simple and the work efficiency is improved.

In step S13, the collector electrode and the emitter electrode are connected respectively.

The collector electrode is located on the bottom surface of the collector gasket and is in electrical contact with the collector gasket; the emitter electrode is located on the top surface of the emitter gasket and is in electrical contact with the emitter gasket.

As described in the embodiment, a loading platform may be provided for the collector electrode, so that both the collector electrode and the collector gasket may be fixed in the lower opening of the outer ring.

In step S14, the gate leading wire is connected.

The gate leading wire is connected to the central gate, and is insulated from the emitter gasket and the emitter electrode.

As described in the above embodiment, a via hole may be provided at a central position of the emitter gasket, a groove is provided on the bottom surface of the emitter electrode, to extend the gate leading wire outside.

After the above steps are performed, the components described above may be further packaged through a package housing. For the IGBT device formed through packaging the whole-wafer IGBT chip, structures shown in FIG. 3a and FIG. 3b may be referred to.

It can be known from the description that, in the IGBT device fabricated based on the whole-wafer IGBT chip, the emitter connection zone of the failure cellular zone is thinned, and the failure cellular zone is disconnected to the emitter electrode of the device through a simple alignment in packaging, thereby achieving the reliability of the packaged device. The whole-wafer IGBT chip, the emitter gasket and the collector gasket can be fixed and limited by the locating collar in the structure described above, the operation is simple and convenient, and the work efficiency is improved.

It should be noted that, the failure cellular zone according to the embodiments of the present disclosure refers to a failure cellular zone caused by a large leakage current between the collector and the emitter.

The description of the embodiments herein enables those skilled in the art to implement or use the present disclosure. Numerous modifications to the embodiments are apparent to those skilled in the art, and the general principles defined herein can be implemented in other embodiments without deviating from the spirit or scope of the present disclosure. Therefore, the present disclosure may not be limited to the embodiments described herein, but is in accordance with the widest scope consistent with the principles and novel features disclosed herein.

The invention claimed is:

1. An IGBT device, comprising:
    a whole-wafer IGBT chip, wherein a top surface of the whole-wafer IGBT chip comprises a central gate connection zone and a plurality of emitter connection zones surrounding the central gate connection zone, and a bottom surface of the whole-wafer IGBT chip comprises a collecting zone, wherein an emitter connection zone located on a surface of a failure cellular zone of the chip is thinned;

a collector gasket fixed on the bottom surface of the chip and an emitter gasket fixed on the top surface of the chip, wherein a radius of the collector gasket is less than a radius of the chip, the collector gasket covers the collecting zone, a radius of the emitter gasket is less than the radius of the chip, and the emitter gasket covers the emitter connection zones but does not cover a terminal zone of the chip;

a collector electrode in electrical contact with the collector gasket and an emitter electrode in electrical contact with the emitter gasket; and a gate leading wire connected to the central gate connection zone, wherein the gate leading wire is insulated from the emitter gasket and the emitter electrode.

2. The IGBT device according to claim 1, further comprising:

a limit collar, configured to fix and limit the collector gasket and the emitter gasket, fix the collector gasket on the bottom surface of the chip and fix the emitter gasket on the top surface of the chip.

3. The IGBT device according to claim 2, wherein the locating collar comprises:

an outer ring, wherein a diameter of a lower opening of the outer ring is the same as a diameter of the collector gasket, and an upper opening of the outer ring comprises a first circular groove and a second circular groove, wherein a diameter of the first circular groove is equal to a diameter of the chip, and a diameter of the second circular groove is greater than the diameter of the chip; and an inner ring, wherein an outside diameter of the inner ring is equal to the diameter of the second groove, and an inside diameter of the inner ring is equal to a diameter of the emitter gasket.

4. The IGBT device according to claim 3, wherein the collector electrode comprises a loading platform carrying the collector gasket, the loading platform is in a shape of cylinder, a diameter of the cylinder is the same as a diameter of the collector gasket, and both the loading platform and the collector gasket are fixed in the lower opening of the outer ring.

5. The IGBT device according to claim 2, wherein the locating collar comprises:

an outer ring, wherein an upper opening of the outer ring comprises a circular groove having a same diameter as a diameter of the chip, a diameter of a lower opening of the outer ring is the same as a diameter of the collector gasket; and an inner ring, wherein an outside diameter of the inner ring is the same as the diameter of the chip, and an inner diameter of the inner ring is the same as a diameter of the emitter gasket.

6. The IGBT device according to claim 2, wherein the locating collar is a collar in an integrated structure surrounding a side face of the chip, an upper opening of the collar is matched with the emitter gasket, and a lower opening of the collar is matched with the collector gasket.

7. The IGBT device according to claim 1, wherein a via hole is provided at a central position of the emitter gasket, a groove is provided on a bottom surface of the emitter electrode, the gate leading wire is connected to the central gate connection zone through the via hole and is extended outside through the groove.

8. The IGBT device according to claim 7, wherein the gate leading wire is connected to the central gate connection zone through soldering; or the gate leading wire is fixed through a spring provided in the via hole, and is connected to the central gate connection zone under pressure of the spring.

9. A method for packaging a whole-wafer IGBT chip, wherein a top surface of the chip comprises a central gate connection zone and a plurality of emitter connection zones surrounding the central gate connection zone, and a bottom surface of the chip comprises a collecting zone, and wherein the method for packaging the whole-wafer IGBT chip comprises:

thinning an emitter connection zone of a failure cellular zone of the chip;

fixing a collector gasket and an emitter gasket, wherein the collector gasket is fixed on the bottom surface of the chip, a radius of the collector gasket is less than a radius of the chip, the collector gasket covers the collecting zone, the emitter gasket is fixed on the top surface of the chip, a radius of the emitter gasket is less than the radius of the chip, and the emitter gasket covers the emitter connection zones but does not cover a terminal zone of the chip;

connecting a collector electrode and connecting an emitter electrode respectively, wherein the collector electrode is in electrical contact with the collector gasket, and the emitter electrode is in electrical contact with the emitter gasket; and connecting a gate leading wire, wherein the gate leading wire is connected to the central gate, and is insulated from the emitter gasket and the emitter electrode.

10. The method for packaging the whole-wafer IGBT chip according to claim 9, wherein the collector gasket and the emitter gasket are fixed and limited through a locating collar, the collector gasket is fixed on the bottom surface of the chip, and the emitter gasket is fixed on the top surface of the chip.

11. The method packaging for the whole-wafer IGBT chip according to claim 10, wherein the collector gasket and the emitter gasket are fixed and limited through a package collar in the following steps:

fixing the collector gasket on the bottom surface of the chip through an outer ring, wherein an upper opening of the outer ring comprises a first circular groove and a second circular groove, wherein a diameter of the first circular groove is equal to a diameter of the chip, the chip is fixed in the first circular groove, a diameter of the second circular groove is greater than the diameter of the chip, a diameter of a lower opening of the outer ring is the same as a diameter of the collector gasket, the collector gasket is fixed inside the lower opening and is contacted with the bottom surface of the chip; and fixing the emitter gasket on the top surface of the chip through an inner ring, wherein an outside diameter of the inner ring is equal to the diameter of the second groove, the inner ring is fixed in the second groove, an inside diameter of the inner ring is equal to a diameter of the emitter gasket, and the emitter gasket is fixed inside the inner ring and is in contact with the top surface of the chip.

12. The method for packaging the whole-wafer IGBT chip according to claim 11, wherein a loading platform is provided on the collector electrode, the loading platform is in a shape of cylinder, a diameter of the cylinder is the same as the diameter of the collector gasket, to carry the collector gasket, and both the loading platform and the collector gasket are fixed inside the lower opening of the outer ring.

13. The method for packaging the whole-wafer IGBT chip according to claim 10, wherein the collector gasket and the emitter gasket are fixed and limited through the locating collar in the following steps:

fixing the collector gasket on the bottom surface of the chip through an outer ring, wherein an upper opening of the outer ring comprises a fixed groove having a same diameter as a diameter of the chip, the chip is fixed in the fixed groove, a diameter of a lower opening of the outer ring is the same as a diameter of the collector gasket, the collector gasket is fixed inside the lower opening and is in contact with the bottom surface of the chip; and fixing the emitter gasket on the top surface of the chip through an inner ring, wherein an outside diameter of the inner ring is equal to a diameter of the groove, the inner ring is provided in the fixed groove where the chip is fixed, an inside diameter of the inner ring is equal to a diameter of the emitter gasket, the emitter gasket is fixed inside the inner ring and is in contact with the top surface of the chip.

14. The method for packaging the whole-wafer IGBT chip according to claim 10, wherein the collector gasket and the emitter gasket are fixed and limited through the locating collar in the following steps:

forming a collar in an integrated structure surrounding a side face of the chip on the side face of the chip, wherein an upper opening of the collar is matched with the emitter gasket, and a lower opening of the collar is matched with the collector gasket;

fixing the collector gasket onto the bottom surface of the chip through the lower opening; and fixing the emitter gasket onto the top surface of the chip through the upper opening.

15. The method for packaging the whole-wafer IGBT chip according to claim 9, wherein the emitter connection zone of the failure cellular zone of the chip is thinned through laser etching or mechanical grinding.

\* \* \* \* \*